United States Patent [19]
Kean

[11] Patent Number: 6,157,211
[45] Date of Patent: *Dec. 5, 2000

[54] FPGA USING RAM CONTROL SIGNAL LINES AS ROUTING OR LOGIC RESOURCES AFTER CONFIGURATION

[75] Inventor: Thomas A. Kean, Edinburgh, United Kingdom

[73] Assignee: Xilinx, Inc., San Jose, Calif.

[*] Notice: This patent is subject to a terminal disclaimer.

[21] Appl. No.: 09/291,992

[22] Filed: Apr. 14, 1999

[51] Int. Cl.$^7$ ................................................. H03K 19/177
[52] U.S. Cl. ................................................. 326/40; 326/38
[58] Field of Search .......................................... 326/37–41

[56] References Cited

U.S. PATENT DOCUMENTS

| 4,866,432 | 9/1989 | Goetting | 340/825.84 |
| 5,099,150 | 3/1992 | Steele | 326/38 |
| 5,162,680 | 11/1992 | Norman et al. | 326/41 |
| 5,352,940 | 10/1994 | Watson | 326/38 |
| 5,444,393 | 8/1995 | Yoshimori et al. | 326/38 |
| 5,465,055 | 11/1995 | Aherns | 326/41 |
| 5,473,267 | 12/1995 | Stansfield | 326/41 |
| 5,563,527 | 10/1996 | Diba | 326/38 |

FOREIGN PATENT DOCUMENTS 9604496  3/1996  United Kingdom .

OTHER PUBLICATIONS

Xilinx, Inc., "The Programmable Logic Data Book," Sep. 1996, available from Xilinx, Inc., 2100 Logic Drive, San Jose, California 95124.
Betty Prince, "Semiconductor Memories", copyright 1983, 1991, John Wiley & Sons, pp. 149–174.
Anthony Stansfield et al., "The Design of a New FPGA Architecture", 1995, Computer Science 975.

*Primary Examiner*—Michael Tokar
*Assistant Examiner*—Don Phu Le
*Attorney, Agent, or Firm*—Edel M. Young

[57] ABSTRACT

A field programmable gate array configured to use RAM control signals as routing and/or logic resources. By using RAM bit lines as routing, and/or to implement Wire-OR functions, and/or with word lines to implement PAL functions, one may increase the efficiency of lines normally used only for programming the control memory.

6 Claims, 5 Drawing Sheets

FPGA USING RAM CONTROL SIGNAL LINES AS ROUTING OR LOGIC RESOURCES AFTER CONFIGURATION

BACKGROUND OF THE INVENTION

1. Field of the Invention

The present invention relates generally to the field of Field Programmable Gate Arrays and more specifically to an increase in the efficiency of signal line usage in an FPGA by employing RAM control lines as routing or logic resources after these lines are used to program control memory.

2. Prior Art

In a SRAM-programmed Field Programmable Gate Array (FPGA) a large proportion of the available metal planes are used by bit line and word line signals required for programming the control memory. In one commercial device approximately one-half of the total available routing resources on the second metal layer are used by RAM bit lines and of the remaining area a proportion is required by power and ground distribution. Numerically, there are 10 user signals routed from east to west on second metal in a unit tile and 16 RAM bit lines. The situation in the north/south direction is less serious with 12 user signals and 3 RAM word lines, but RAM signals still use a significant proportion of the available resources. After configuration of the device, the state of the RAM control memory is often not changed and these control signals are normally unused. A technique which could make use of these expensive resources for routing or logic within user designs would have considerable benefits. The techniques described here are most applicable to an FPGA where the control memory is partitioned into many smaller memories and the device can tolerate random values in its control memory without causing contention on tri-state routing resources. Such an FPGA is disclosed in British Patent Application No.9604496.1 filed on Mar. 1, 1996 and entitled "EMBEDDED MEMORY FOR FIELD PROGRAMMABLE GATE ARRAY". These techniques are also applicable to blocks of embedded RAM within a more conventional FPGA. The Programmable Logic Data Book published in 1996 by Xilinx, Inc., contains relevant information and is incorporated herein by reference. Other relevant information may be obtained from the following:

1) "Semiconductor Memories", Betty Prince, Wiley 1991.
2) "The Design of a New FPGA Architecture", Anthony Stansfield and Jan Page in Lecture Notes in Computer Science 975, Springer Verlog 1995;
3) U.S. patent application Ser. No. 08/460,314 filed on Jun. 2, 1995 by inventor Steven Churcher and entitled "Sense Amplifier For Reading Logic Devices".

The latter reference discloses a preferred sense amplifier for use in the present invention and is therefore incorporated herein by reference.

SUMMARY OF THE INVENTION

Use Of Ram Bit Lines As Routing Resources

A RAM bit line is a metal segment like any other metal segment on the device and can therefore be used as a routing signal line. This has not been done in previous FPGA's because of the logical separation in designers' minds between "RAM control" signals like bit lines and "user logic" signals. According to the invention, RAM bit lines are reused after configuration as signal routing lines. Precautions must be taken when using the lines as a routing resource that the RAM cells attached to the bit line are not disturbed. This can easily be achieved by ensuring that all the RAM word lines are at 0 volts except during device programming—this is normally the case in current FPGA's. To use RAM bit lines as a routing resource all that is required is to install a second driver circuit at the opposite end of the bit line from the sense amplifier and/or a duplicate sense amplifier to allow routing in the opposite direction. It must also be possible to disable the routing resource driver circuits on the bit lines during device programming. Because RAM bit lines have a relatively high capacitive load it may be desirable to use a sense amplifier to sense signals being transferred on them to increase speed. In many cases sense amplifiers will already be provided at one end of the RAM bit line for use by the programming circuitry during memory reads.

Use Of Ram Bit Lines To Implement Wide Wire-Or Functions

Perhaps more attractive than the use of bit lines as conventional routing segments, is their use to implement wire OR functions. In this case, pull down devices are placed at many locations along a RAM bit line. These pull downs are controlled by the logical AND of three signals—an enable signal that indicates the bit lines are not needed for device programming; a local memory cell output which indicates that a particular signal should take part in the wire OR; and a local logic signal (e.g. the output of a cell function unit). The state of the wire is sensed by a sense amplifier at the edge of the array in the same way as a conventional RAM cell. The output of the sense amplifier must be selectable as an input on a user routing multiplexer.

Use Of Ram Bit And Word Lines To Implement Pal Functions

A programmable array logic (PAL) AND/OR structure can be built using RAM cells as control memory. Each product term is a wire NOR function. RAM cells select the sets of input variables. Bit line signals and product terms may share a single wire. A block of RAM can be readily configured to function as a PAL with no additional array overhead. This PAL mode can be used for content addressable memory (CAM) type matching of input data against stored values.

OBJECTS OF THE INVENTION

It is therefore a principal object of the present invention to provide an FPGA wherein bit lines used for programming control memory, are also used for routing or logic functions after device configuration is completed.

It is another object of the invention to provide a configurable logic device having control memory for programming the device, the control memory receiving bit and word signals over bit and word lines, the latter being configured for redundant use for routing and/or logic functions.

It is still another object of the invention to provide a configurable logic device wherein control RAM bit lines are used as routing and/or wire-OR functions.

It is still another object of the invention to provide a configurable logic device wherein control RAM bit and word lines are used to implement programmable array logic (PAL) functions.

It is still another object of the invention to provide a configurable logic device wherein control RAM bit and word lines are used to implement a Content Addressable Memory (CAM) mode.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

DETAILED DESCRIPTION OF PREFERRED EMBODIMENTS

Figure 1:
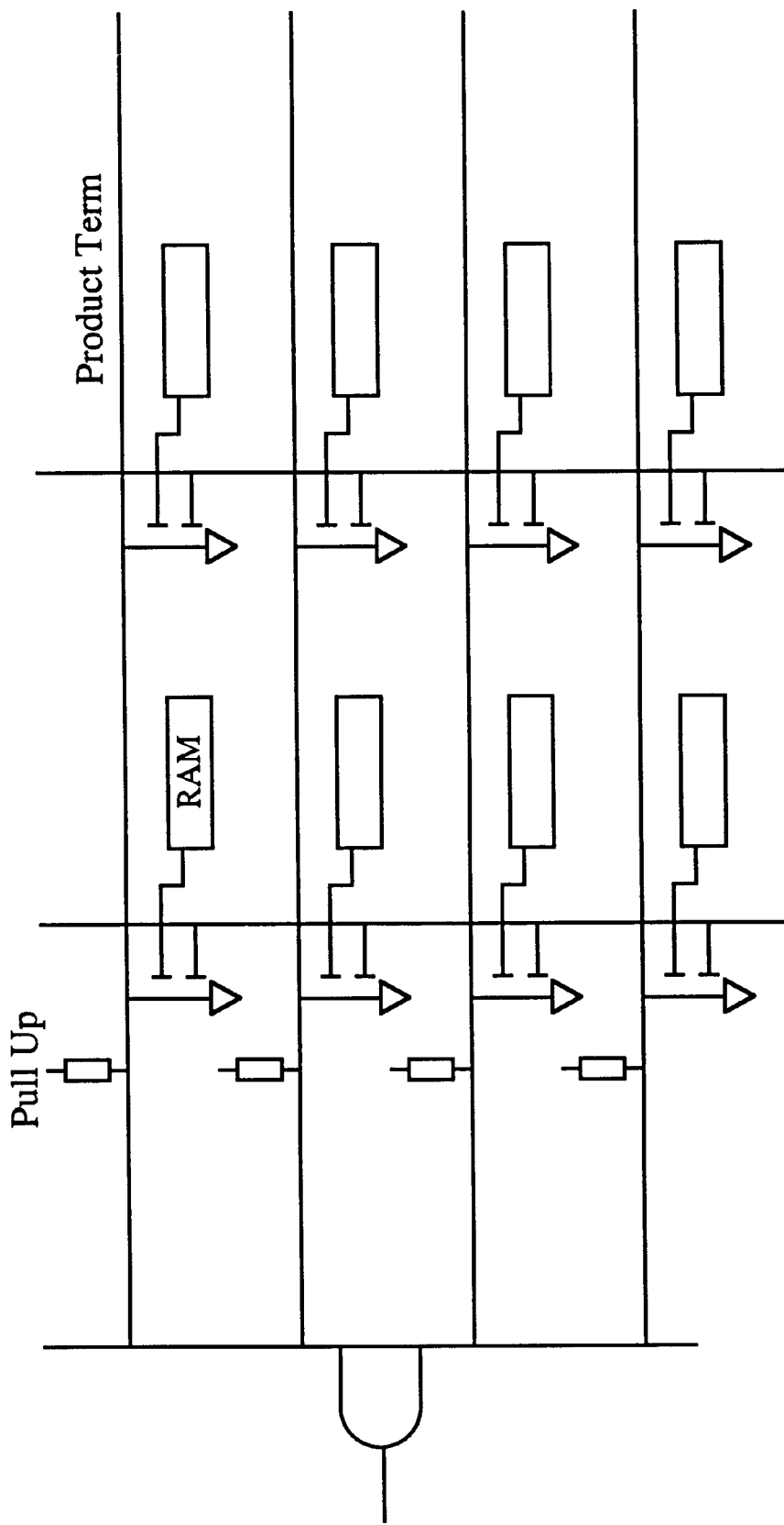
FIG. 1 is a block diagram of a PAL-like AND/OR structure built using RAM cells.

FIG. 1 illustrates how a Programmable Array Logic like AND/OR structure can be built using RAM cells as control memory. Each product term is a wire NOR function. The set of input variables which take part in a given product term is selected by the RAM cells. The RAM cell at the intersection of the product term row and the input variable column holds "1" if that input variable is to take part in the wire NOR function. If both the RAM cell holds "1" and the input variable is "1" then the product term line is pulled low, otherwise it is held high by the pull up resistor or other pull-up device such as a transistor with a sense amplifier. It will be understood that the pull-up symbol shown as a resistor block in the accompanying figures, may be any such pull-up device. Normally, adjacent vertical signals hold an input variable and its complement.

Figure 2:
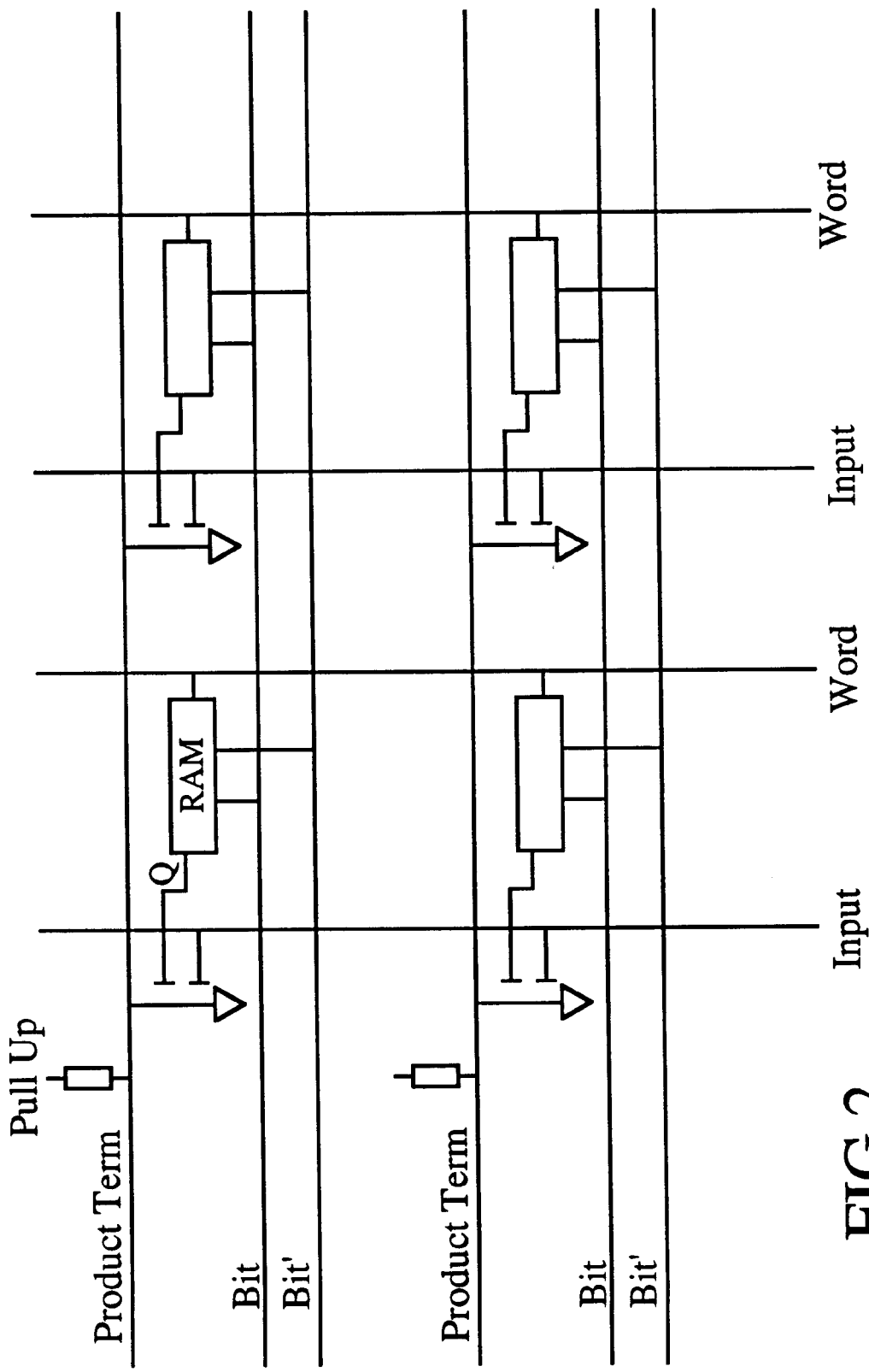
FIG. 2 is a block diagram illustrating an enlarged view of a portion of FIG. 1 including the signals for reading and writing the RAM cells.
Figure 3:
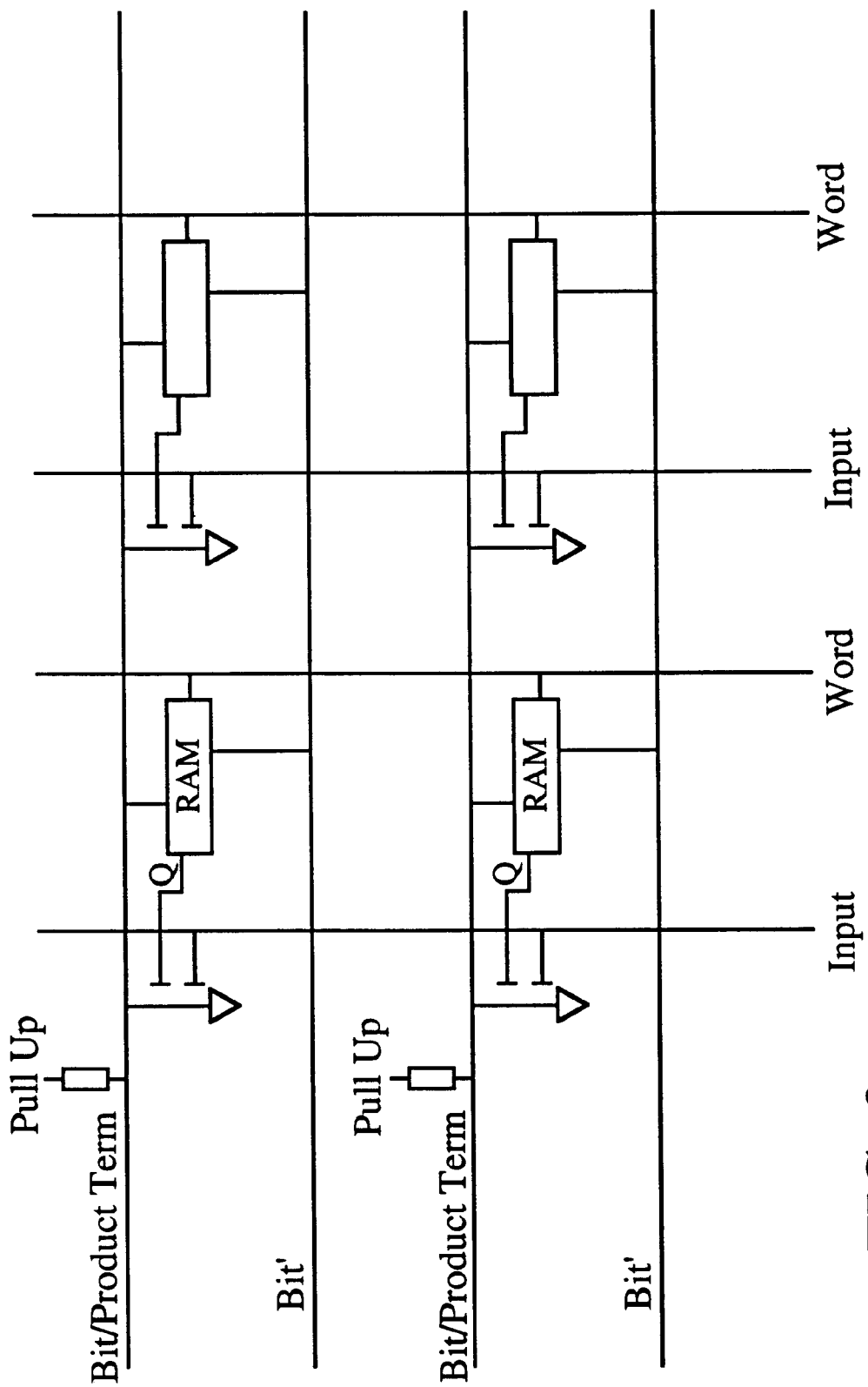
FIG. 3 is a block diagram similar to FIG. 2, but illustrating a modified structure wherein a single wire is used for both a bit line and a product term.

FIG. 2 is a close up view of part of FIG. 1, including the signals necessary for reading out of and writing into the RAM cells. Assuming there is no need to access the RAM cells at the same time as evaluating a PAL function, the product term and bit line signals may share a single wire. FIG. 3 illustrates a modified structure with the bit line and product term sharing a single wire.

Figure 4:
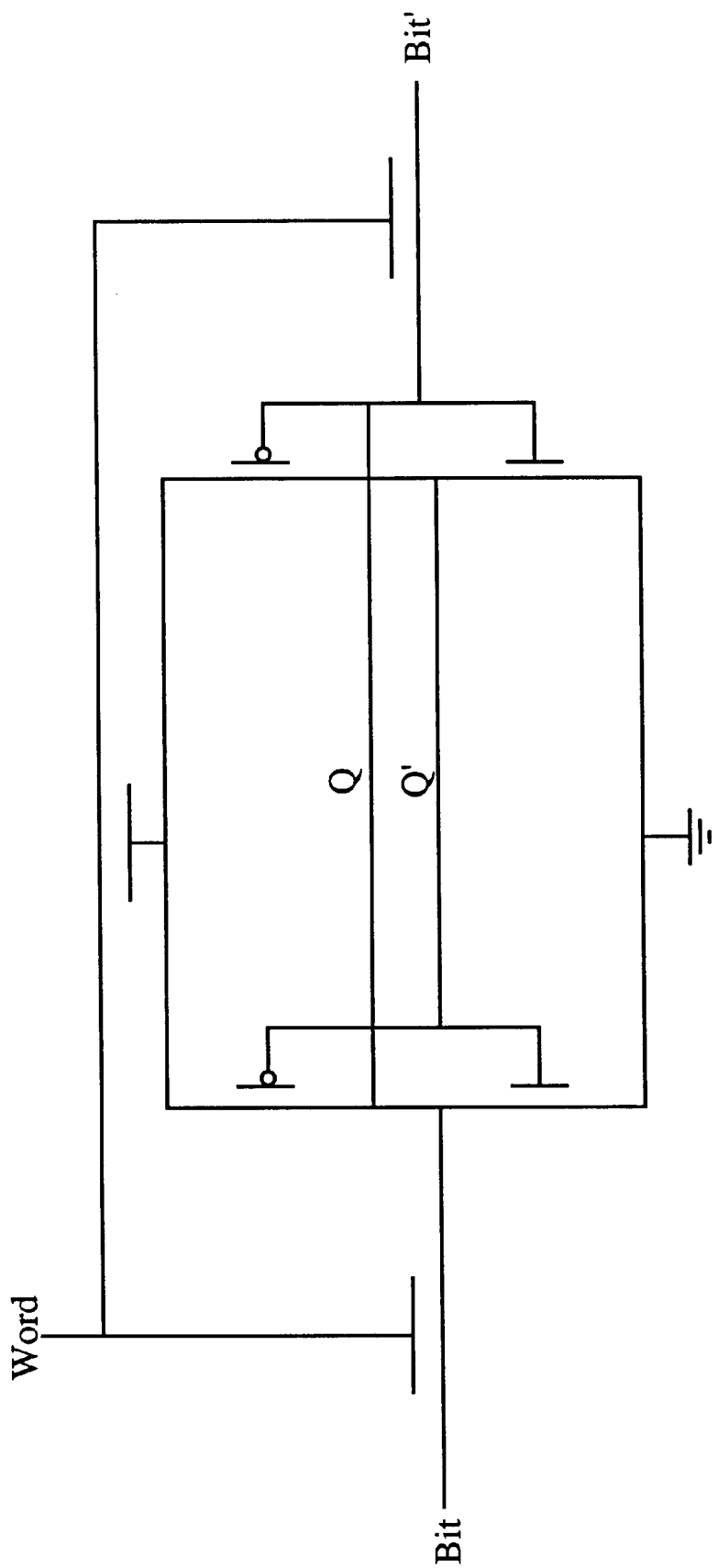
FIG. 4 is a schematic diagram of a six transistor RAM cell used in the invention.

FIG. 4 illustrates a six transistor static RAM cell. Consider the case when the cell holds a "0" i.e. Q=0 and both bit and bit' are held high by large external drivers. When the word line goes high, the cell will attempt to pull the bit line low via the word line pass transistor. When the cell holds a "1", when the word line goes high, nothing will happen on Bit (because the bit line voltage is already equal to the voltage on Q). This is a normal RAM read cycle and provided both Bit and Bit' are held high before the word line is brought high, the cell will not be overwritten. The current flow on the bit line in the case where the cell holds a 0 can be sensed by a sense amplifier and a zero will be read. This is exactly the behavior required in a PAL circuit. If the PAL input variables are connected to the RAM word lines (so multiple RAM word lines can be high, unlike a conventional RAM) then the memory will function as a set of PAL product terms. This is extremely advantageous in a programmable logic device. A block of RAM can function as a PAL with no overhead in the array itself.

Figure 5:
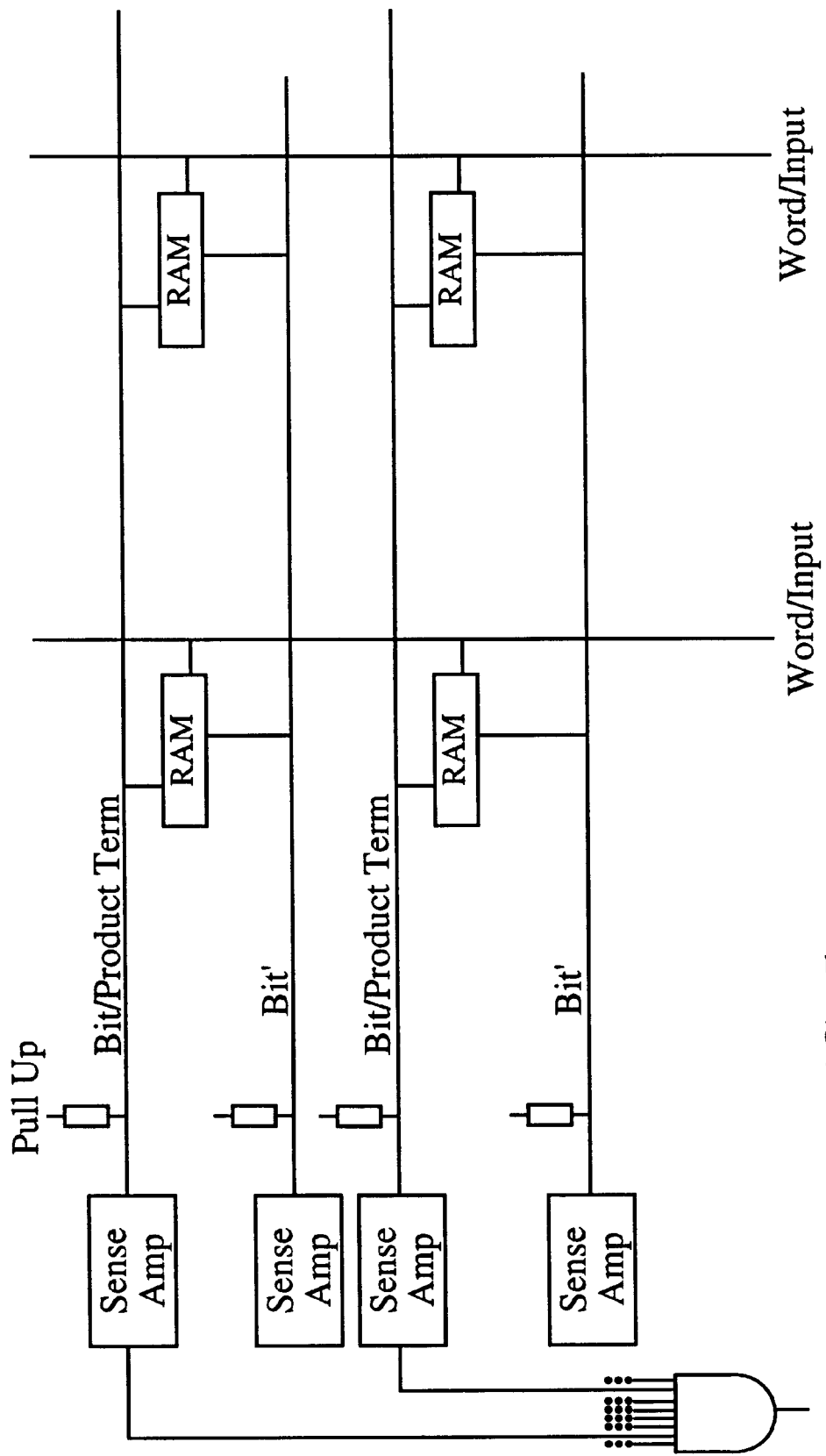
FIG. 5 is a block diagram of a combined RAM/PAL structure of the invention.

FIG. 5 illustrates the structure of the combined RAM/PAL described above. Bit and product term share one line. Word and an input variable share one line. Each row (BIT and BIT') comprises a sense amplifier. There are two major design concerns with this structure when operating in PAL mode: 1) Making sure that the RAM cells are not accidentally overwritten; and 2) Minimizing the power consumption. Many techniques are available and choosing an appropriate set will be dependant on, among other things, the process characteristics used to manufacture the device, the power supply voltage at which the device will be operated and the desired characteristics for a particular application (e.g. whether speed is more important than power consumption).

Possible Design Techniques For PAL Mode

1. Split the RAM word lines so that the bit and bit' pass transistors operate off separate signals. During PAL mode, enable only the Bit pass transistor. This effectively halves the power consumption because contention between RAM cells and pull-ups only occurs on the Bit line. It also frees up the Bit' line for use as a routing signal as described above.

2. Drive the word line only to an intermediate voltage (e.g. 2V on a 5V process) rather than use full logic swings. This makes the pass transistor between the RAM cell and the bit lines a much better conductor of logic 0's than logic 1's. The PAL circuit is trying to detect a single RAM cell attempting to pull the Bit line low against the effects of the pull-up transistor and (potentially) many other RAM cells trying to pull it high. This technique makes a RAM cell containing 0 much less susceptible to being overwritten.

3. Further segment the word line using logic gates and control memory cells so that the word line signal only goes high on groups of product terms which are required by the logic equations being implemented.

4. Use transition detection circuits on the inputs and latch the outputs so that the high current evaluation of the logic function only occurs when necessary.

Implementing CAM Functions

Content Addressable Memory like matching of input data against stored values can be implemented using the PAL mode described above. It requires two columns of RAM for each input signal. The first is connected to the signal; the second to its complement. If the Product term line goes low, the input signal matches the stored value on that row. There are two bits of RAM per input signal on each row. There are 4 possible decodings of these RAM bits 00=>never match, 01=>match 0, 10=>match 1, 11=>match 1 or 0. The last corresponds to wildcard or don't care matching.

In addition to detecting matches, CAM's are required to output a value based on the match detected. In the simplest case this could be the row number of the first row to match. More commonly, each row would have a register containing a user determined value and the CAM would output the register value of the first matching row. This part of the CAM functionality requires additional per-row logic.

It will now be understood that what has been described herein comprises a field programmable gate array configured to use RAM control signals as routing and/or logic resources. By using RAM bit lines as routing, and/or to implement Wire-OR functions, and/or with word lines to implement PAL functions, one may increase the efficiency of lines normally used only for programming the control memory.

Those having skill in the relevant arts will now, as a result of the disclosure herein, perceive various additions and modifications which may be made to the invention. A number of such modifications have been referred to herein by way of example. Accordingly, such additions and modifications are deemed to be within the scope of the invention which is to be limited only by the appended claims and their equivalents.

I claim:

1. A field programmable gate array having a plurality of random access memory cells addressable by bit lines and word lines for storing control data, the gate array comprising:

a plurality of sense amplifiers, at least one respective sense amplifier connected to a respective bit line to sense signals being transferred on each such respective bit line; and first and second drivers coupled to each bit line for driving signals on said bit line from opposite directions;

said bit lines being configured for bidirectional signal transfer for routing logic signals in said gate array.

2. The field programmable gate array recited in claim 1 wherein at least some of said bit lines are configured as wire-OR input lines for alternate use as logic devices in said gate array.

3. The field programmable gate array recited in claim 1 wherein said bit lines are configured as product term input lines and said word lines are configured for carrying input variable signals, wherein said product term input lines function as wire logic and further incuding RAM cells configured to select among the input variables on said word lines to be operated on by said wire logic.

4. A field programmable gate array comprising:

a plurality of random access memory cells addressable by bit lines and word lines for storing control data;

first and second drivers coupled to each bit line for driving signals onto said bit line from opposite directions;

said bit lines being configured for bidirectional signal transfer for alternate use for routing logic signals in said gate array.

5. The field programmable gate array recited in claim 4 wherein at least some of said bit lines are configured as wire-OR input lines for alternate use as logic devices in said gate array.

6. The field programmable gate array recited in claim 4 wherein said bit lines are configured as product term input lines and said word lines are configured for carrying input variable signals, wherein said product term input lines function as wire logic and said random access memory cells are configured to select among the input variables on said word lines to be operated on by said wire logic.

* * * * *